United States Patent [19]

Worsham

[11] Patent Number: 4,661,033

[45] Date of Patent: Apr. 28, 1987

[54] APPARATUS FOR UNLOADING WAFERS FROM A HOT BOAT

[75] Inventor: Daniel A. Worsham, San Jose, Calif.

[73] Assignee: Pacific Western Systems, Inc., Mountain View, Calif.

[21] Appl. No.: 643,198

[22] Filed: Aug. 22, 1984

[51] Int. Cl.$^4$ ............................................. B65G 65/04
[52] U.S. Cl. .................................. 414/405; 29/426.3; 118/500; 118/731; 118/728; 414/421; 414/786; 432/239; 432/261
[58] Field of Search ............... 414/786, 222, 287, 403, 414/404, 405, 406, 415, 419, 421, 425, 758, 764, 765, 766, 767; 118/500, 503, 728, 729, 730, 731; 29/426.3; 432/239

[56] References Cited

U.S. PATENT DOCUMENTS

| | | | |
|---|---|---|---|
| 3,247,988 | 4/1966 | Cease | 414/421 X |
| 3,638,930 | 2/1972 | Hart, Jr. | 432/261 X |
| 3,863,685 | 2/1975 | Parkes | 414/421 X |
| 3,934,733 | 1/1976 | Worden | 414/405 |
| 3,949,891 | 4/1976 | Butler et al. | 414/405 |
| 4,023,691 | 5/1977 | Perel | 414/403 X |
| 4,223,048 | 9/1980 | Engle, Jr. | 118/728 X |
| 4,244,673 | 1/1981 | Henderson | 414/786 X |
| 4,344,730 | 8/1982 | Dvorak | 414/405 |
| 4,406,572 | 9/1983 | Karcher | 414/404 |
| 4,484,538 | 11/1984 | Sarkozy et al. | 118/728 X |

Primary Examiner—Frank E. Werner
Attorney, Agent, or Firm—Harry E. Aine

[57] ABSTRACT

Wafers are unloaded from a hot wafer processing boat of the type having a plurality of elongated parallel electrodes defining elongated processing gaps therebetween with the wafers being serially spaced apart lengthwise of the gap. A wafer carrier, into which the wafers are to be unloaded from the hot boat, has elongated receiving means, preferably formed by folds of the wafer carrier, extending lengthwise of the elongated electrodes of the boat. The wafer carrier is positioned over the boat and the boat and the carrier are inverted so that the wafers drop from the hot boat into the receiving means of the wafer carrier. In a preferred embodiment, once the wafers have been unloaded onto the folded wafer carrier, the wafer carrier is unfolded to facilitate access to the wafers.

3 Claims, 10 Drawing Figures

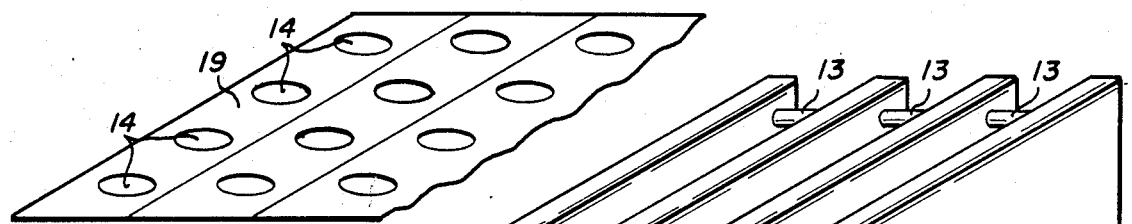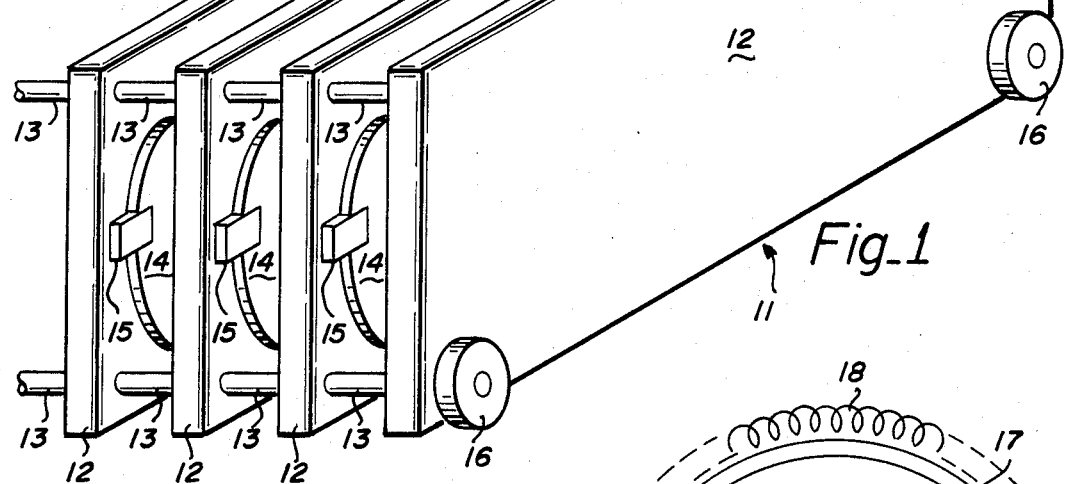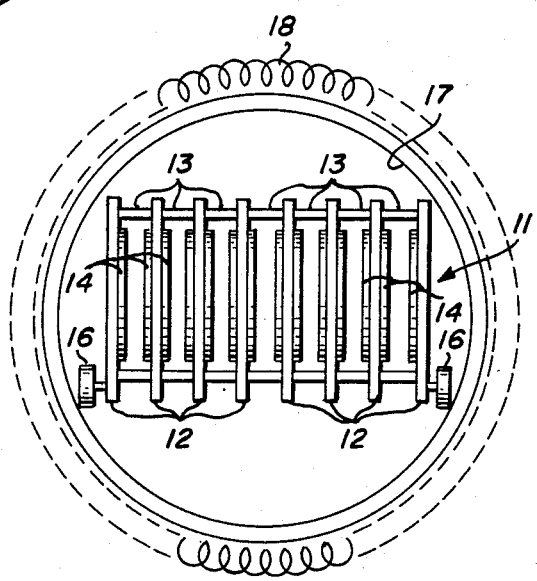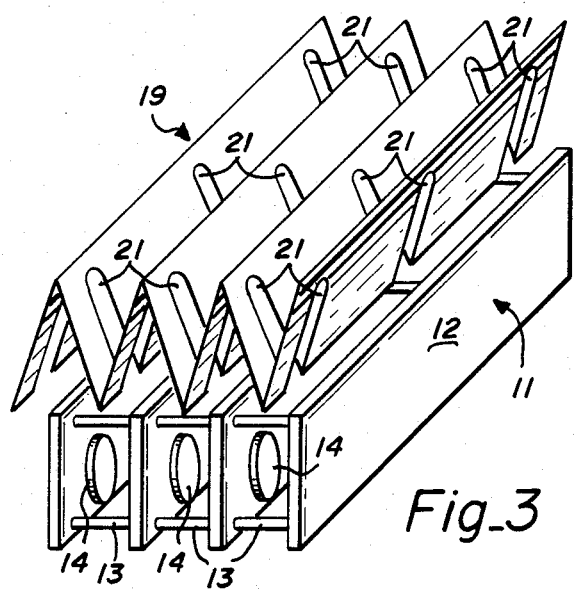

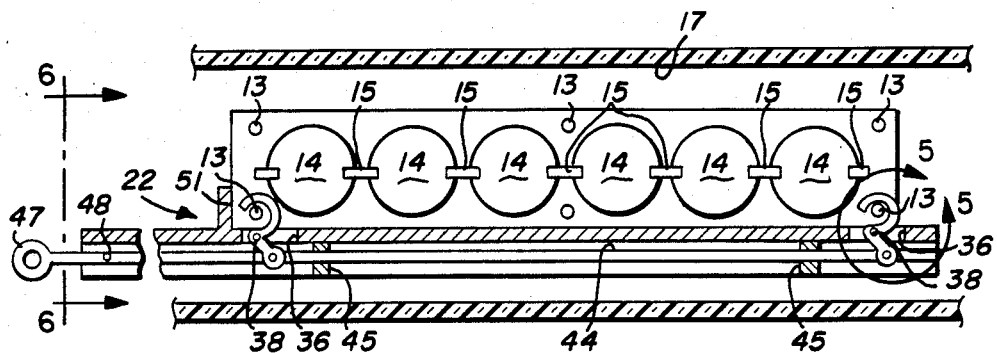
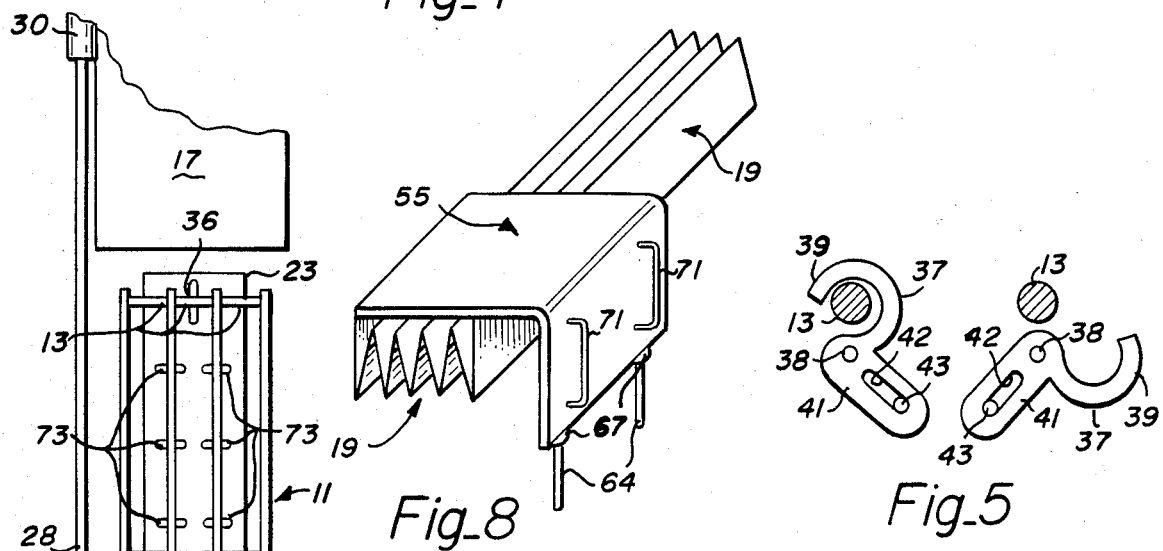
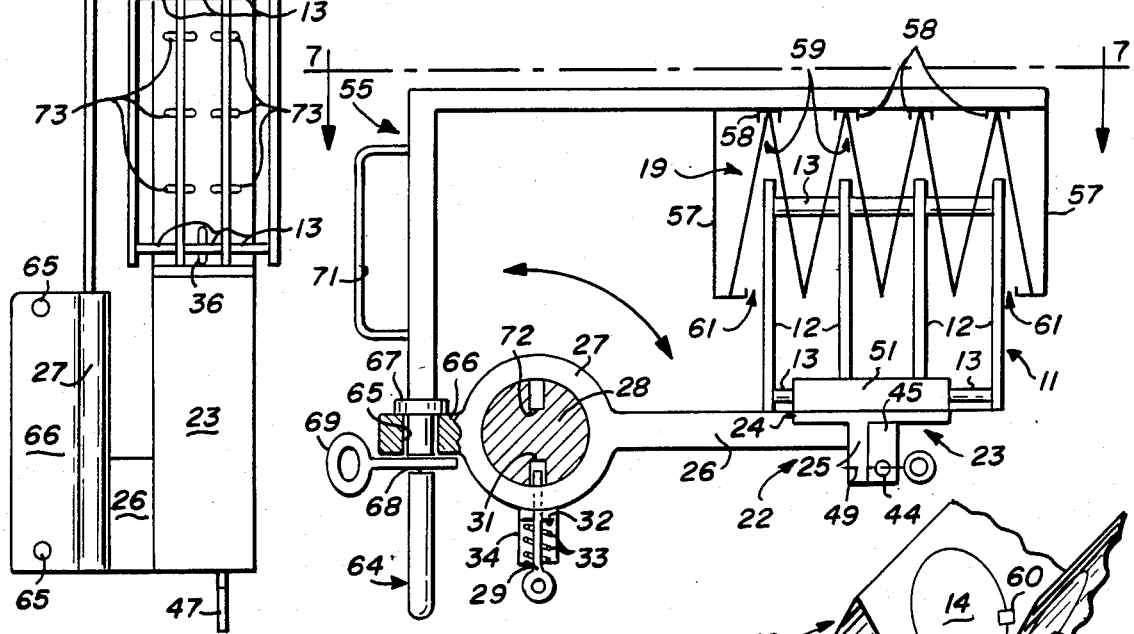
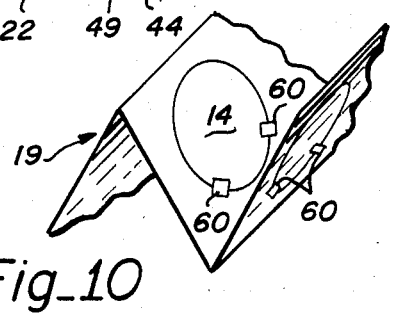

APPARATUS FOR UNLOADING WAFERS FROM A HOT BOAT

BACKGROUND OF THE INVENTION

The present invention relates in general to method and apparatus for unloading wafers from a hot boat and, more particularly, to unloading wafers from a plasma enhanced chemical vapor deposition boat of the type having a plurality of elongated interleaved electrodes extending lengthwise of a tubular furnace.

DESCRIPTION OF THE PRIOR ART

Heretofore, wafers have been processed in a plasma enhanced chemical vapor deposition machine of the type wherein a plurality of elongated interleaved graphite electrodes are disposed within and extend lengthwise of a cylindrical quartz furnace tube of the type generally employed for diffusion furnaces. Wafers are positioned, for processing, in serial relation along the elongated electrodes and adjacent the mutually opposed major faces of the graphite electrodes which define the processing gaps therebetween. Radio frequency energy is applied across the processing gaps via the electrodes to produce a plasma enhanced chemical vapor deposition of silicon dioxide or silicon nitride upon the faces of the wafers facing into the respective processing gaps.

This process is normally conducted at temperatures in excess of 350 degrees C. When the process is completed, the wafer processing boat formed by the elongated interleaved graphite electrodes is withdrawn from the furnace tube. Due to the elevated temperature of the processing boat and due to its relatively high thermal capacity, a substantial time is required for the boat to cool to ambient temperature for removal of the wafers. For example, it is not uncommon for the boat to cool for one half hour before the wafers can be removed from the boat. During this cooling time, while the wafers and the boat are still at elevated temperature, undesired chemical reactions can occur, due to atmospheric contaminants, on the exposed surfaces of of the wafers. In addition, the boat cooling time represents a substantial loss of operating time and/or uneconomic use of the boats.

Processing machines of the aforecited type are disclosed and claimed in U.S. Pat. No. 4,223,048 issued Dec. 16, 1980 and assigned to the same assignee as the present invention.

It would be desired to provide an improved method and apparatus for unloading such wafers from a hot processing boat.

It is also known from the prior art of unloading wet wafer processing boats to invert the boat over a wafer carrier so that wafers drop from the wet processing boat into respective retaining slots in the wafer carrier. Such a system is disclosed in U.S. Pat. No. 3,934,733 issued Jan. 27, 1976.

SUMMARY OF THE PRESENT INVENTION

The principal object of the present invention is the provision of an improved method and apparatus for unloading wafers from a hot processing boat of the type having a plurality of elongated parallel electrodes with wafers serially spaced apart lengthwise of the processing gaps defined between the parallel electrodes.

In one feature of the present invention, a wafer carrier is positioned below the hot boat containing the wafers to be unloaded, such wafer carrier having elongated receiving means extending lengthwise of the elongated electrodes of the boat, and dropping the wafers from the hot boat into the receiving means of the wafer carrier, whereby the wafers are removed from the hot processing boat.

In another feature of the present invention, the wafer receiving means of the wafer carrier comprises a folded member with the folds running longitudinally of the elongated parallel boat electrodes such that the wafers drop into the folds of the wafer carrier.

In another feature of the present invention, the folded wafer carrier is unfolded to facilitate access to the unloaded wafers in the unfolded wafer carrier.

In another feature of the present invention, the wafer carrier is initially positioned adjacent the hot boat and the hot boat is then elevated relative to the wafer carrier, whereby the wafers are transferred from the boat into the receiving means of the wafer carrier.

In another feature of the present invention, the wafer carrier is initially positioned over the hot boat and the boat and the wafer carrier are then inverted such that the wafers transfer by gravity out of the hot boat into the retaining means of the wafer carrier.

Other features and advantages of the present invention will become apparent upon a perusal of the following specification taken in connection with the accompanying drawings wherein:

BRIEF DESCRIPTION OF THE DRAWINGS

FIG. 1 is a perspective view of a wafer processing boat of the type employed in practicing the present invention;

FIG. 2 is a transverse sectional view, partly in schematic form, of a wafer processing boat as loaded into a processing furnace;

FIG. 3 is a schematic perspective view of a wafer carrier and boat incorporating features of the presnt invention;

FIG. 4 is a longitudinal sectional view of a wafer processing boat within a furnace tube and incorporating features of the present invention;

FIG. 5 is an enlarged detail view of a portion of the structure of FIG. 4 delineated by line 5—5 and depicting a latch in two positions;

FIG. 6 is a transverse sectional view of a portion of the structure of FIG. 4 taken along lines 6—6 in the direction of the arrows and depicting the wafer carrier in position over the wafer processing boat as withdrawn from the furnace tube;

FIG. 7 is a plan view of the structure of FIG. 6 taken along line 7—7 in the direction of the arrows and being of reduced scale;

FIG. 8 is a perspective view of the wafer carrier and its support structure and incorporating features of the present invention;

FIG. 9 is an unfolded view of the wafer carrier of the present invention carrying wafers thereon; and FIG. 10 is a perspective view of a portion of the wafer carrier of the present invention depicting a wafer being supported thereon.

DESCRIPTION OF THE PREFERRED EMBODIMENTS

Referring now to FIG. 1, there is shown a wafer processing boat 11 of the type employed in the present invention. The wafer processing boat 11 is of conventional design such as that shown in the aforecited U.S.

Pat. No. 4,223,048 issued Sept. 16, 1980, the disclosure of which is hereby incorporated by reference in its entirety. Briefly, the wafer processing boat 11 includes a plurality of elongated electrodes 12 as of graphite insulatively secured together in parallel spaced apart relation via the intermediary of a plurality of electrical insulator members 13. Wafers 14, which are to be processed, are held against the mutually opposed major faces of the electrodes 12 via graphite tabs 15 which overhang the lips of the wafers 14 and are positioned slightly below the horizontal diameter of the wafers to define pockets for retaining the wafers 14 in position adjacent the electrodes 12. Wheels 16 are positioned at the four corners of the boat 11 for riding on the interior surface of the furnace tube 17, as more clearly shown below with regard to FIG. 2.

Referring now to FIG. 2, the wafer processing boat 11 is shown in position for processing within a quartz furnace tube 17, such tube being surrounded by incandescent heating elements 18 for heating the interior of the tube 17 by radiation. The tube 17 is closed on its ends via quartz end caps, not shown, and processing gas is caused to flow axially through the tube 17 at subatmospheric pressure such as 0.5 torr. Radio frequency power is applied between adjacent interleaved electrodes 12 to produce a plasma in the processing gaps between the adjacent electrodes 12. The plasma produces chemically active vapor products of the plasma discharge which interact with the faces of the wafers 14, facing into the processing gaps, for processing of the wafers 14. In a typical example, the wafers 14 and the boat 11 operate, during the wafer processing, at an elevated temperature such as 350 degrees C.

Once the processing is completed, the evacuated tube 17 is let up to atmospheric pressure, as by backfilling with dry nitrogen gas, and one end cap is removed and the boat 11 retracted axially of the tube 17.

Referring now to FIG. 3, there is a schematic representation of method and apparatus, according to the present invention, for unloading the wafers 14 from the hot processing boat 11. More particularly, a wafer carrier 19 is formed by folding a thin sheet of stainless steel into a generally accordian geometry. The accordian wafer carrier 19 is positioned above the hot processing boat 11 with alternate folds of the carrier 19 inserted within the processing gaps in the manner as shown in FIG. 6.

The folded wafer carrier 19 is slotted at 21 such that the wafer carrier 19 will pass over the insulator bodies 13 and into the processing gaps. The wafer carrier 19 and hot processing boat 11 are then inverted such that the wafers 14 drop out of their retaining pockets 15 into the folds of the folded wafer carrier 19. This allows the wafers to be unloaded from the hot processing boat 11 without the operator having to reach into each of the processing gaps with tweezers or the like to remove the individual wafers 14. Once the wafers 14 have been removed from the hot processing boat 11, they cool rapidly due to their thermal conductivity and relatively low thermal mass. Cooling can be further facilitated by unfolding the wafer carrier 19 as shown in FIG. 9. This also facilitates access to the cooled wafers for transfer from the carrier 19 to a conventional wafer carrier wherein the wafers are coaxially aligned in axially spaced relation.

Referring now to FIGS. 4-8, there is shown an apparatus for removing the hot processing boat 11 from the furnace tube and for unloading the wafers from the hot processing boat 11 into a wafer carrier 19. More particularly, during processing, the wafer processing boat 11 is located midway of the length of the quartz furnace tube 17, as shown in FIG. 4. Upon termination of processing, an end cap is removed and the boat unloading mechanism 22 is axially inserted within the tube 17 slightly below the lower extent of the boat 11. The unloading mechanism includes a T-bar structure 23 having an upper flange 24 and a dependent generally centrally disposed flange 25. The T-bar is fixedly secured as by welding to a plate-shaped arm 26 carried from a sleeve 27 slideably received on a rod 28 carried from the furnace tube support structure at 30. The sleeve 27 is captured against rotation on the rod 28 by means of a key 29 extending radially through the sleeve 27 and riding within a longitudinal key slot 31 in the rod 28. The key 29 includes a flange 32 which is spring biased, via spring 33, radially inwardly into the key slot 31. A cylindrical housing 34 is carried from the sleeve 27 and houses coaxially therewithin the spring 33, key 29 and flange 32. The outer end wall of housing 34 is centrally apertured for passage of the key 29 therethrough.

The T-bar includes a pair of longitudinal slots 36 in which a pair of hooks 37 are pivotally mounted on pins 38. The pins 38 are fixedly secured to the top flange 23 and extend transversely across the respective slots 36. The pivotable hooks 37 include crescent shaped hook portions 39 which pivot over and serve to lock the insulator bodies 13 to the T-bar member 23. The pivotable hooks 37 include right angle lever arm portions 41 which are longitudinally slotted at 42 to receive actuating pins 43 slideable within the slots 42. The actuating pins 43 are transversely carried of an actuator rod 44 extending longitudinally of the T-bar structure 23 and carried therefrom via bushings 45 fixedly secured to both the horizontal and vertical flange portions 24 and 25 of the T-bar 23. A handle 47 is formed at the operator end of the actuating rod 44 for effecting slideable movement of the actuator rod for locking and unlocking the clamps 37. The actuator rod 44 is also transversely bored at 48 to receive a pin 49 passing therethrough and through an aligned opening in the flange 25 for locking the actuator rod in the clamped or locked position as shown in FIG. 4.

A vertical stop member 51 is carried from the upper surface of the flange 24 of the T-bar 23 for arresting relative sliding movement between the boat 11 and the T-bar 23 when the actuator rod 44 is pushed forward to achieve a lock of the boat 11 to the T-bar 23. The stop 51 also serves to register the position of the boat 11 over the respective clamps 37 when the T-bar 23 is moved into position under the boat 11 as located within the furnace tube 17.

After the boat 11 has been locked or clamped to the T-bar assembly 23, the wafer loading and unloading mechanism 22 is retracted axially of the furnace tube 17 by sliding the assembly 22 outwardly on the guide rod 28. When the boat 11 has been fully retracted from the furnace tube 17, the folded wafer carrier 19, as carried from an L-shaped support structure 55 is dropped into the processing gaps between the interleaved electrodes 12, as shown in FIG. 6. The slots 21 in the folded wafer carrier sheet 19 accommodate the insulator bodies 13 to allow the folded wafer carrier 19 to penetrate well into the regions inbetween the electrodes 12. The folded wafer carrier sheet 19 is slideably accommodated within a channel member 57 dependently carried from the L-shaped support structure 55. In addition, guide channel numbers 58 are carried from the L-shaped support structure 55 for positioning the folded regions 59 of the wafer carrier member 19. The lips 61 of the dependent channel member 57 are turned up to act as retaining members for retaining the side edges of the folded carrier sheet 19 within the channel 57.

The wafer carrier support structure 55 includes a pair of dependent guide pin assemblies 64 which are slideably received within a pair of alignment holes 65 in a flange portion 66 of the sleeve 27. The guide pin assemblies 64 include flanges 67 serving as stops for determining the vertical position of the wafer carrier 19 as inserted within the wafer boat 11. In addition, one of the guide pins 64 includes a transverse bore 68 to receive a locking pin 69 which is inserted for locking the wafer carrier support structure 55 to the wafer loading and unloading mechanism 22. A pair of handles 71 are affixed to the wafer carrier support structure 55 to allow the operator to carry the support structure 55.

Once the wafer carrier 19 is positioned within the boat 11, as shown in FIG. 6, the operator pulls the key lock pin 29 and, by grasping one of the handles 71, rotates the wafer loading and unloading mechanism 22 about the axis of the guide rod 28 either in the clockwise or counter-clockwise direction for approximately 180 degrees to invert the position of the boat 11 relative to the wafer carrier 19. When the wafer carrier 19 has been inverted relative to the boat 11, the spring loaded key lock 29 is released to engage an upper key slot 72 in the guide rod 28, thereby locking the wafer loading and unloading mechanism 22 in the inverted position. When the boat 11 is inverted relative to the wafer carrier 19, the wafers will drop by gravity from their retaining pockets 15 into the folds of the wafer carrier 19. In some instances, the deposition of material, such as silicon dioxide or silicon nitride, tends to bind the wafers 14 to the respective electrodes 12. In such a case, the upper flange portion 24 of the T-bar assembly 23 is provided with a plurality of apertures at 73 to allow the operator to insert a tool for dislodging the respective wafers 14 such that they will fall from the retaining pockets 15 into the folds of the wafer carrier.

Once the wafers have been unloaded from the boat 11 into the wafer carrier 19, the retaining pin 69 is pulled and the operator drops the wafer carrier support structure 55 with wafers and wafer carrier 19 away from the loading and unloading mechanism 22 and carries the wafers to a cooling station. At the cooling station, the wafers may be allowed to cool in the folded wafer carrier 19 or the wafer carrier 19 may be slipped out of the wafer carrier support structure 55 and opened as shown in FIG. 9 to facilitate access to the wafers for transfer of the wafers to a conventional wafer carrier. Once the wafers have been dropped from the hot wafer processing boat 11, they cool rapidly in the folded wafer carrier structure 19 due to the relatively low thermal mass of the respective wafers and their high thermal conductivity.

In a preferred embodiment of the wafer carrier 19 as shown in FIG. 10, tabs 60 are pressed outwardly of the sheet to restrain the lower periphery of the respective wafers 14 to prevent the wafers from slipping all the way into the folded region of the wafer carrier sheet.

The advantage of the present invention is that it provides a convenient method and apparatus for unloading wafers from a hot plasma enhanced chemical vapor deposition boat such that the wafers may be rapidly cooled to reduce their exposure time to contamination at elevated temperature.

What is claimed is:

1. In a wafer carrier apparatus for unloading wafers from a hot boat of the type having a plurality of elongated parallel electrodes defining elongated processing gaps therebetween with the wafers being serially spaced apart lengthwise of the gaps, said boat being loaded in use and inserted axially within an elongated furnace tube for heating the wafers and the boat to an elevated wafer processing temperature and after processing, the boat is withdrawn axially of the furnace tube to surrounding it for unloading:

wafer carrier means for positioning below the hot boat to receive the wafers to be unloaded from the boat; and said wafer carrier means having a plurality of foldable elongated receiving means in a corrugated configuration having ridge and valley portions with the ridge portions extending lengthwise of and into the spaces between the elongated electrodes of the boat such that by inverting the boat and the carrier the wafers are caused to drop from the hot boat into said elongated receiving means of said wafer carrier, whereby said wafer carrier means can be unfolded to facilitate access to the unloaded wafers as carried by said wafer carrier means.

2. The apparatus of claim 1 including means for initially positioning said wafer carrier means adjacent the hot boat; and means for at least partially inverting the hot boat over the wafer carrier means whereby the wafers drop from the hot boat into the elongated receiving means of said wafer carrier.

3. The apparatus of claim 2 wherein said means for at least partially inverting the hot boat over said wafer carrier means includes means for initially positioning said wafer carrier over the hot boat and wherein said means for inverting the hot boat over said carrier means includes means for inverting said wafer carrier and the hot boat, whereby the wafers drop out of the hot boat into said receiving means of said wafer carrier.

* * * * *